US010203570B2

(12) United States Patent
    Long

(10) Patent No.: US 10,203,570 B2
(45) Date of Patent: Feb. 12, 2019

(54) ARRAY SUBSTRATE, DISPLAY PANEL AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/561,185

(22) PCT Filed: Apr. 7, 2017

(86) PCT No.: PCT/CN2017/079709
§ 371 (c)(1),
(2) Date: Sep. 25, 2017

(87) PCT Pub. No.: WO2018/040560
PCT Pub. Date: Mar. 8, 2018

(65) Prior Publication Data
US 2018/0252972 A1    Sep. 6, 2018

(30) Foreign Application Priority Data
Aug. 31, 2016    (CN) .................... 2016 2 1033726 U

(51) Int. Cl.
*H01L 27/12* (2006.01)
*G02F 1/1343* (2006.01)
(Continued)

(52) U.S. Cl.
CPC ...... *G02F 1/134363* (2013.01); *G02F 1/1343* (2013.01); *G02F 1/1362* (2013.01);
(Continued)

(58) Field of Classification Search
None
See application file for complete search history.

(56) References Cited

U.S. PATENT DOCUMENTS

| 2002/0057411 A1* | 5/2002 | Kim ................. G02F 1/133512 349/141 |
| 2002/0131003 A1* | 9/2002 | Matsumoto ........... G02F 1/1345 349/139 |

(Continued)

FOREIGN PATENT DOCUMENTS

| CN | 1420386 A | 5/2003 |
| CN | 2700914 Y | 5/2005 |

(Continued)

OTHER PUBLICATIONS

Search Report and Written Opinion dated Jul. 27, 2017 from State Intellectual Property Office of the P.R. China.

*Primary Examiner* — Shaun M Campbell
(74) *Attorney, Agent, or Firm* — Dilworth & Barrese, LLP; Michael J. Musella, Esq.

(57) ABSTRACT

An array substrate, a display panel and a display device are disclosed. The array substrate includes: a plurality of gate lines, a plurality of data lines, and a plurality of common electrodes disposed on a base substrate. The plurality of gate lines are extended in a first direction, the plurality of data lines are extended in a second direction. Each of the common electrodes includes an overlap section which overlaps at least one of the data lines in a direction perpendicular to the base substrate. A gap is provided between the overlap sections of two adjacent common electrodes in the second direction, the two adjacent common electrodes overlap the same data lines in the direction perpendicular to the base substrate. An intersection of the data line and the gate line between the two adjacent common electrodes is located within the gap.

14 Claims, 3 Drawing Sheets

(51) Int. Cl.
*G02F 1/1362* (2006.01)
*G02F 1/1368* (2006.01)

(52) U.S. Cl.
CPC ...... *G02F 1/1368* (2013.01); *G02F 1/136286* (2013.01); *H01L 27/12* (2013.01); *H01L 27/124* (2013.01); *G02F 2001/134318* (2013.01); *G02F 2201/121* (2013.01); *G02F 2201/123* (2013.01); *G02F 2201/124* (2013.01)

(56) References Cited

U.S. PATENT DOCUMENTS

| | | | |
|---|---|---|---|
| 2002/0191138 A1* | 12/2002 | Matsumoto | G02F 1/134363 349/141 |
| 2005/0140637 A1* | 6/2005 | Yi | G09G 3/3614 345/98 |
| 2007/0002244 A1* | 1/2007 | Park | G02F 1/134363 349/141 |
| 2013/0161604 A1* | 6/2013 | Huang | G02F 1/13458 257/43 |
| 2016/0252789 A1* | 9/2016 | Zheng | G02F 1/136213 349/43 |

FOREIGN PATENT DOCUMENTS

| | | |
|---|---|---|
| CN | 102890373 A | 1/2013 |
| CN | 103063701 A | 6/2013 |
| CN | 104914639 A | 9/2015 |
| CN | 206020892 U | 3/2017 |

* cited by examiner

ARRAY SUBSTRATE, DISPLAY PANEL AND DISPLAY DEVICE

TECHNICAL FIELD

At least one embodiment of the disclosure relates to an array substrate, a display panel and a display device.

BACKGROUND

In-plane switching (IPS) liquid crystal display mode utilizes a pixel electrode and a common electrode in the same plane to form a parallel electric field parallel to the surface of the glass or electrode, so that the liquid crystal molecules are deflected in a plane parallel to the surface of the glass, in order to display. For an IPS pixel structure, a common electrode is disposed in the same layer of the pixel electrode, to form an interdigital electrode shape.

SUMMARY

At least one embodiment of the disclosure relates to an array substrate, a display panel and a display device. Embodiments of the disclosure provide an array substrate of in-plane switching (IPS) liquid crystal display mode, which can rectify the disordered electric field at the edge region of the sub-pixels, reduce the light leakage and color mixing, increase the aperture ratios of the sub-pixel and of the pixel.

At least one embodiment of the disclosure provides an array substrate, which comprises a plurality of gate lines, a plurality of data lines, and a plurality of common electrodes disposed on a base substrate; wherein, the plurality of gate lines are extended in a first direction; the plurality of data lines are extended in a second direction, the plurality of data lines are intersected with the plurality of gate lines and insulated from the plurality of gate lines, and the second direction is different from the first direction; the plurality of common electrodes are arranged in the second direction, at least one of gate lines is disposed between two adjacent common electrodes, the plurality of common electrodes and the plurality of data lines are insulated from each other; each of common electrodes comprises an overlap section, the overlap section overlaps at least one of data lines in a direction perpendicular to the base substrate; a gap is provided between the overlap sections of two adjacent common electrodes in the second direction, both of the overlap sections overlap a same data line of the data lines in the direction perpendicular to the base substrate; an intersection of the at least one of data lines and the at least one of gate lines between two adjacent common electrodes is located within the gap.

At least one embodiment of the disclosure provides a display panel, which comprises any one of the array substrates provided in embodiments of the disclosure.

At least one embodiment of the disclosure provides a display device, which comprises any one of the display panels provided in embodiments of the disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS

Figure 1:
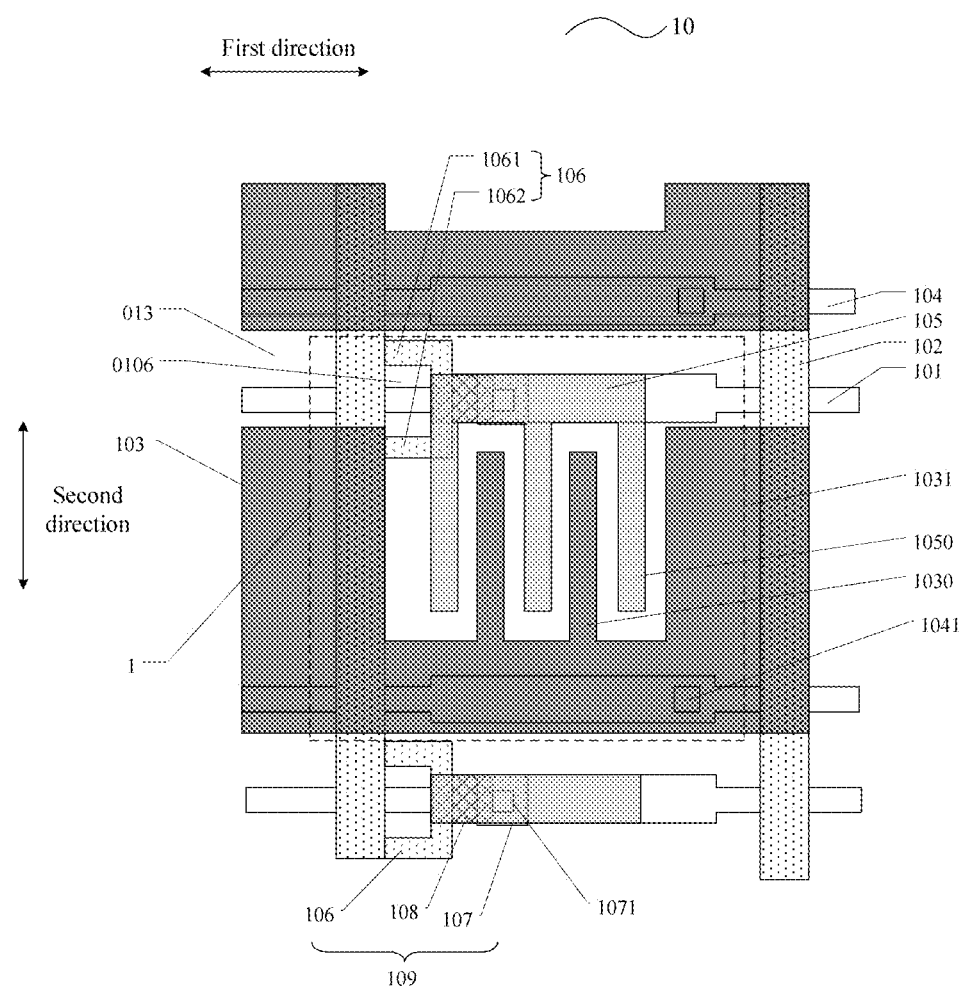
FIG. 1 schematically illustrates an array substrate according to an embodiment of the disclosure.

10—base substrate; 101—gate line; 102—data line; 103—common electrode; 1030—common electrode strip; 1031—overlap section; 1032—common electrode link; 104—common electrode line; 1041—via for common electrode line; 105—pixel electrode; 1050—pixel electrode strip; 106—source; 1061—sub-source; 1062—sub-source; 107—drain; 1071—via for drain; 108—active layer; 109—thin film transistor; 013—gap; 1-sub-pixel; 0106—hollow section.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "a," "an," "the," etc., are not intended to indicate the 1 number imitation, but to indicate at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For in-plane switching (IPS) liquid crystal display, it generally has a lower aperture ratio due to a large wiring area occupied by a thin film transistor and its gate lines, common electrodes, and common electrode lines. At the same time, the disordered electric field at the edge region of the sub-pixels caused by an interconnection of the common electrodes of adjacent sub-pixels may result in a light leakage and color mixing, and further reduce the aperture ratio.

Embodiments of the disclosure provide an array substrate, a display panel and a display device. The array substrate comprises a plurality of gate lines, a plurality of data lines, and a plurality of common electrodes disposed on a base substrate. The plurality of gate lines are extended in a first direction. The plurality of data lines are extended in a second direction, the plurality of data lines are intersected with the plurality of gate lines and insulated from the plurality of gate lines, and the second direction is different from the first direction. The plurality of common electrodes are arranged in the second direction, a gate line is disposed between two adjacent common electrodes, the plurality of common electrodes and the plurality of data lines are insulated from each other. Each of the common electrodes comprises an overlap portion which overlaps at least one of the data lines in a direction perpendicular to the base substrate. In the second direction, a gap is provided between the overlap portions of two adjacent common electrodes, both of the overlap portions of two adjacent common electrodes overlap the same data line 102 in the direction perpendicular to the base substrate 10. An intersection of the data line and the gate line between two adjacent common electrodes is located within the gap. By using the array substrate, the disordered electric field at the edge region of the sub-pixels can be rectified, thereby reducing light leakage and color mixing, increasing the aperture ratio of the sub-pixels, and increasing the aperture ratio of the pixels.

With reference to the drawings, the array substrate provided in the present embodiments will be described in the following. In the drawings, the source, drain, pixel electrode and common electrode are depicted in translucent state, in order to make the relationship between the respective layers more clearly.

An embodiment of the disclosure provides an array substrate, as illustrated in FIG. 1, the array substrate comprises: a plurality of gate lines 101, a plurality of data lines 102, and a plurality of common electrodes 103 disposed on a base substrate 10. To simplify the figures, only a part of the upper common electrode is shown in FIG. 1. As illustrated in FIG. 1, the plurality of gate lines 101 are extended in a first direction. The plurality of data lines 102 are extended in a second direction, the plurality of data lines 102 are intersected with the plurality of gate lines 101 and insulated from the plurality of gate lines 101, and the second direction is different from the first direction. In FIG. 1, the first direction is a horizontal direction in the plane of paper, the second direction is a vertical direction in the plane of paper, the first direction is perpendicular to the second direction, and the first direction and the second direction are not limited to those shown in FIG. 1. For example, the plurality of gate lines 101 are intersected with the plurality of data lines 102 and insulated from the plurality of data lines 102, the plurality of gate lines 101 and the plurality of data lines 102 are intersected with each other to define a plurality of sub-pixels 1. One sub-pixel 1 is shown in dashed box of FIG. 1.

As illustrated in FIG. 1, the plurality of common electrodes 103 are arranged in the second direction, a gate line 101 is disposed between two adjacent common electrodes 103, the plurality of common electrodes 103 and the plurality of data lines 102 are insulated from each other. Each of the common electrodes 103 comprises an overlap section 1031 which overlaps at least one of the data lines 102 in a direction perpendicular to the base substrate 10. In the second direction, a gap 013 is provided between the overlap sections 1031 of two adjacent common electrodes 103, both of the overlap sections 1031 overlap the same data line 102 in the direction perpendicular to the base substrate 10. An intersection of the data line 102 and the gate line 101 between two adjacent common electrodes 103 is located within the gap 013. The present embodiment is described by taking one gate line 101 disposed between an upper common electrode 103 and an adjacent lower common electrode 103 as an example. It is to be noted that, the number of the gate lines 101 between two adjacent common electrodes 103 may be more than one, which is not limited to the embodiment. The present embodiment is described by taking the overlap section 1031 overlapping one data line 102 in a direction perpendicular to the base substrate 10 as an example. In case that a plurality of data lines are provided between two adjacent columns of sub-pixels, such as two data lines, the overlap section 1031 may overlap a plurality of data lines 102 between two adjacent columns of sub-pixels in the direction perpendicular to the base substrate 10.

It is to be noted that, the data lines illustrated in FIG. 1 are in linear shape, but the shape of data lines is not limited to that shown in FIG. 1, for example, the data lines may be fold lines and so on. Accordingly, the overlap section 1031 of the common electrode 103 is not limited to that shown in FIG. 1, it can be varied in accordance with the shape of data lines.

As illustrated in FIG. 1, one sub-pixel region comprises a common electrode 103, the common electrode 103 comprises an overlap section 1031 and a plurality of common electrode strips 1030, and the overlap section 1031 and the plurality of common electrode strips 1030 are electrically connected with each other. A pixel electrode 105 comprises a plurality of pixel electrode strips 1050, the plurality of pixel electrode strips 1050 and the plurality of common electrode strips 1030 are alternately arranged in the sub-pixel region, and a parallel electric field is generated between the pixel electrode and the common electrode formed in the same layer, so as to drive the liquid crystal to rotate. It is to be noted that, the pixel electrode and the common electrode may be formed in different layers, for example, the pixel electrode and the common electrode on an array substrate of advanced-super dimensional switching (ADS) mode are disposed in different layers. Moreover, as an example, at least one of the pixel electrode and the common electrode comprises a plurality of electrode strips. The configuration of the sub-pixel 1 is not limited to that shown in FIG. 1. For example, two gate lines are disposed between two adjacent rows of sub-pixels. For example, two data lines are disposed between two adjacent columns of sub-pixels. The present embodiment is described by taking the common electrode strips 1030 and the pixel electrode strips 1050 being in linear shape as an example, but the shape of the common electrode strips 1030 and the pixel electrode strips 1050 is not limited to the embodiment, for example, the common electrode strips 1030 and the pixel electrode strips 1050 may be in the shape of fold line and so on.

In the array substrate provided in the present embodiment, a gap 013 is provided between the overlap sections 1031 of two adjacent common electrodes 103, such that an upper common electrode 103 and an adjacent lower common electrode 103 are spaced apart from each other by the gap 103. In comparison with the situation where common electrodes are disposed within the gap, the electric field generated in the gap can be eliminated. As a result, the disordered electric field at the edge of sub-pixel region is reduced, thereby increasing the aperture ratio and reducing the light leakage and color mixing.

In addition to an overlapping part which overlaps the data lines 102 in the direction perpendicular to the base substrate 10, the overlap section 1031 may further comprises a non-overlapping part. For example, as illustrated in FIG. 1, the length of the overlap section 1031 in the first direction is equal to or greater than the length of the data line 102 in the first direction, the data line 102 overlaps the overlap section 1031 in the direction perpendicular to the base substrate 10. As a result, the electric field generated between the overlap section 1031 and the pixel electrode 105 can drive the liquid crystal to rotate at the edge of the sub-pixel, thereby increasing the aperture ratio of the sub-pixel.

For example, as illustrated in FIG. 1, each of common electrodes 103 corresponds to one sub-pixel. In another example, each of common electrodes 103 corresponds to a row of sub-pixels, that is, one common electrode 103 is disposed at a position corresponding to a row of sub-pixels. In yet another example, each of common electrodes 103 corresponds to a plurality of rows of sub-pixels, such as two rows of sub-pixels, that is, one common electrode 103 is disposed at a position corresponding to a plurality of rows of sub-pixels, which is not limited to the present embodiment. For example, two adjacent common electrodes are insulated from each other.

For example, as illustrated in FIG. 1, the part of gate line 101 at the intersection with the data line 102 has smaller width than the part of gate line 101 between two adjacent data lines (i.e., the part within the sub-pixel region). The reduction in width of the gate line 101 at the intersection with the data line 102 can reduce the parasitic capacitance. For example, in order to achieve effective signal transmission and form a lower parasitic capacitance, the width of the part of gate line 101 at the intersection with the data line 102 is ranged from 1/10 to 1/2 of the width of the part of gate line 101 between two adjacent data lines 102.

For example, according to an example of the present embodiment, as illustrated in FIG. 1, the array substrate further comprises a common electrode line 104 electrically connected with the common electrode 103, the common electrode line 104 is parallel to the gate line 101. The common electrode line 104 and the gate line 101 may be formed simultaneously by performing a single patterning process on the same layer of metal film. For example, as illustrated in FIG. 1, the gate line 101 and the common electrode line 104 are disposed in the same layer, and are disposed on two sides of the sub-pixel respectively, respectively.

For example, as illustrated in FIG. 1, the part of common electrode line 104 at the intersection with the data line 102 has smaller width than the part of common electrode line 104 between two adjacent data lines (i.e., the part within the sub-pixel region). The reduction in width of the common electrode line 104 at the intersection with the data line 102 can reduce the parasitic capacitance, reduce the light leakage and color mixing, and increase the aperture ratio. For example, in order to achieve effective signal transmission and form a lower parasitic capacitance, the width of the part of common electrode line 104 at the intersection with the data line 102 is ranged from 1/10 to 1/2 of the width of the part of common electrode line 104 between two adjacent data lines 102.

For example, as illustrated in FIG. 1, according to an example of the present embodiment, the array substrate further comprises a thin film transistor 109. The thin film transistor 109 comprises a source 106 electrically connected with the data line 102. The source 106 comprises at least two branches 1061 and 1062 electrically connected with each other, each branch is electrically connected with the data line 102. The source 106 further comprises a hollow section 0106 between two adjacent branches 1061 and 1062. The connection between the data line 102 and the source 106 having the hollow section 0106 can reduce the parasitic capacitance, increase the channel width and the charging current, thereby improving the display quality. Moreover, if one of the branches has a problem such as an open circuit, it would not affect the electrical connection between the source 106 and the data line 102, such that the defect-free ratio is maintained. For example, the length of the portion of active layer 108 between the source 106 and the drain 107 is considered as the channel width of the thin film transistor 109. For example, the length of the source 106 and the length of the drain 107 are both in a range from 2 μm to 30 μm, the width of the source 106 and the width of the drain 107 are both in a range from 2 μm to and 10 μm, and the source 106 is electrically connected with the data line 102.

As an example, a process of fabricating the thin film transistor 109 comprises: sequentially forming a gate insulation layer and an active layer 108 on a gate line 101 (for example, a gate is formed in the same layer as a gate line 101, and the gate is electrically connected with the gate line 101; forming a data line 102, a source 106 and a drain 107 on the active layer 108, the data line 102, the source 106 and the drain 107 are formed in the same layer. The gate of the thin film transistor 109 is formed under the active layer 108 and in the same layer as the gate line 101. The source 106 and the drain 107 may be in directly contact with the active layer 108. A passivation layer is formed on a source/drain metal layer, for example, the passivation layer is made from an inorganic insulating material or an organic insulating material. A pixel electrode 105 and a common electrode 103 may be formed on the passivation layer, and the pixel electrode 105 and the common electrode 103 are formed in the same layer. A drain via 1071 is formed in the passivation layer above the drain 107, and the pixel electrode 105 is electrically connected with the drain 107 through the drain via 1071. A via 1041 for common electrode line is formed in both the gate insulation layer and the passivation layer above the common electrode line 104, and the common electrode 103 are electrically connected with the common electrode line 104 through the via 1041 for common electrode line.

The present embodiment is described by taking the common electrode formed on the data line as an example. It is to be noted that, the common electrode may be formed firstly and then the data line is formed, so it is not limited to the present embodiment.

For example, as illustrated in FIG. 1, in the array substrate provided in an example of the present embodiment, there is an overlap region between the pixel electrode 105 and the gate line 101 in the direction perpendicular to the base substrate 10, and a storage capacitance may be formed in the overlap region. For example, the width of the overlap region between the pixel electrode 105 and the gate line 101 is in a range from 2 μm to 30 μm.

For example, according to an example of the present embodiment, the width of the overlap region between the common electrode 103 and the common electrode line 104 is in a range from 2 μm to 30 μm; the width of the overlap region between the common electrode 103 and the data line 102 is in a range from 2 μm to 30 μm. For example, the width of the pixel electrode strip 1050 is in a range from 2 μm to 10 μm, the width of the gate line 101 is in a range from 2 μm to 30 μm.

In FIG. 1, only a partial structure of the array substrate is shown, the numbers of the gate line 101, the data line 102, the common electrode line 104, the common electrode 103 and the pixel electrode 105 on the array substrate is not limited to that shown in the figure.

Figure 2:
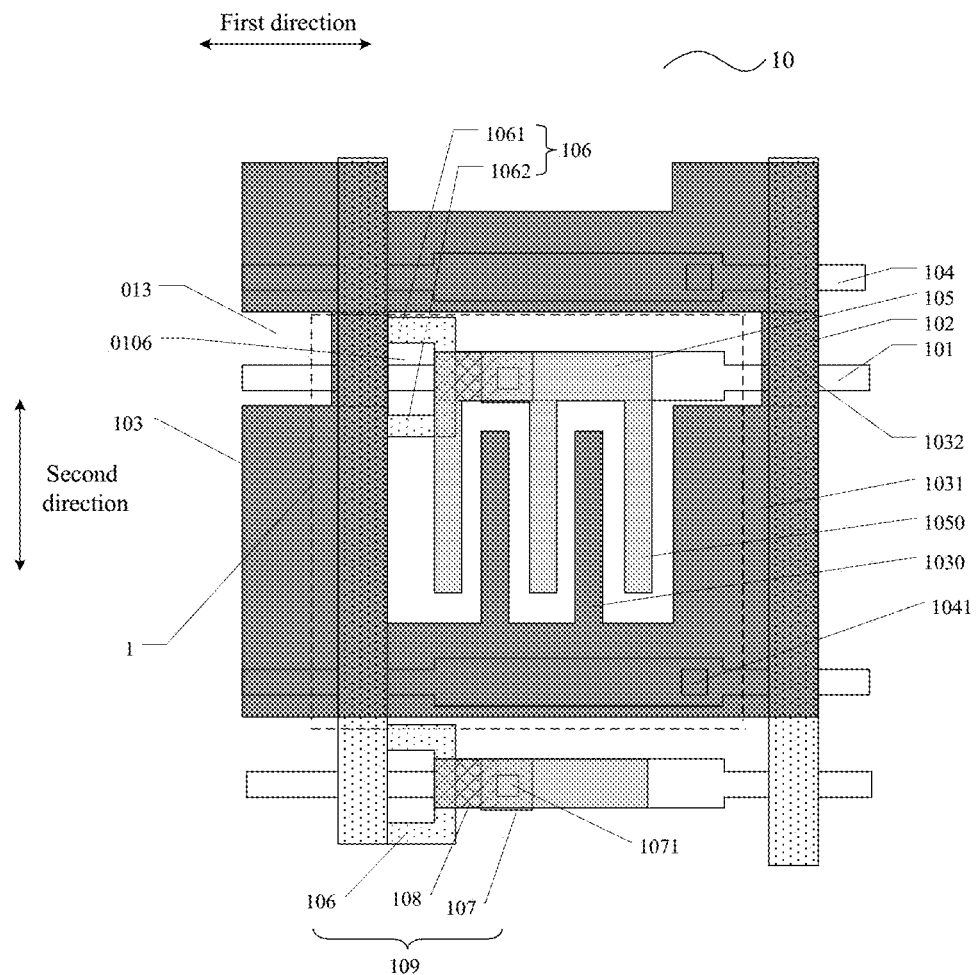
FIG. 2 schematically illustrate another array substrate according to an embodiment of the disclosure.

Another embodiment of the disclosure provides an array substrate, as illustrated in FIG. 2, the present embodiment is different from the above embodiment shown in FIG. 1 in that: the array substrate further comprises a common electrode link 1032, which is disposed in the gap 013 and overlaps the data line 102 in a direction perpendicular to a base substrate 10. The common electrode link 1032 is electrically connected with the overlap sections of two adjacent common electrodes 103 in the second direction, so that two adjacent common electrodes 103 are electrically connected with each other. The length of the common electrode link 1032 in the first direction is smaller than the length of the overlap section 1031 in the first direction. The common electrode link 1032 and the data line 102 are insulated from each other, and the common electrode link 1032 and the gate line 101 are insulated from each other. The length of the common electrode link 1032 in the first direction, which is disposed in a gap 013 and overlaps with the data line 102 in the direction perpendicular to the base substrate 10, is smaller than the length of the overlap section 1031 connected with the common electrode link 1032 in the first direction. In comparison with the situation where the length of the common electrode link 1032 in the first direction is equal to the length of the overlap section 1031 in the first direction, the present embodiment may rectify the disordered electric field chaos at the edge of pixel region, thereby reducing the light leakage and color mixing, increasing the aperture ratio of sub-pixels, and increasing the aperture ratio of pixels.

Yet another embodiment of the disclosure provides an array substrate, as illustrated in FIG. 2, the present embodiment is different from the above embodiment shown in FIG. 1 in that: a gate line 101 and a common electrode line 104 are disposed on the same side of a sub-pixel 1 and there is no overlap region between a pixel electrode 105 and the gate line 101 in a direction perpendicular to a base substrate 10, but there is an overlap region between the pixel electrode 105 and a common electrode line 104 in the direction perpendicular to a base substrate 10, and a storage capacitance is formed in the overlap region between the pixel electrode 105 and the common electrode line 104. For example, the line width of the overlap region is in a range from 2 μm to 30 μm.

Figure 3:
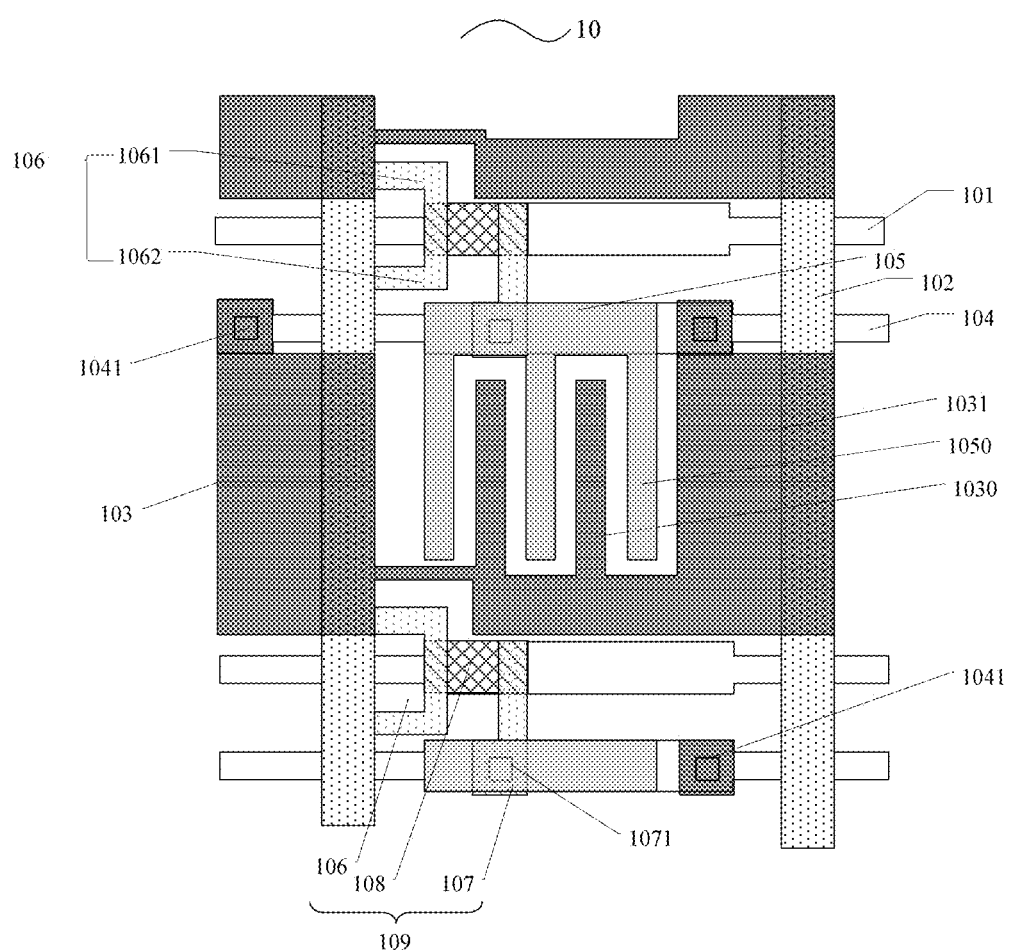
FIG. 3 schematically illustrates yet another array substrate according to an embodiment of the disclosure.

In FIGS. 1 to 3, the data line is in linear shape, but it may not be in linear shape. For example, the data line may be in fold line shape, such as a jagged line in the second direction. The shape of the data line in the second direction is not limited to the present embodiment. Accordingly, the shape of the overlap section 1031 of the common electrode can be changed in accordance with the shape of the data line which overlaps the overlap section 1031. The drawings are only for the purpose of illustration and thus are not limitative of the disclosure.

Still another embodiment of the disclosure provides a display panel, which comprises any one of the array substrates described in above embodiments.

Yet another embodiment of the disclosure provides a display device, which comprises any one of the display panels described in above embodiment.

There are following points needed to be explained:

(1) Unless otherwise defined, the same reference signs refer to the same meaning in drawings and embodiments of the disclosure.

(2) In the drawings of the present disclosure, only the structures related to the embodiments of the present disclosure are referred to, and other structures may be referred to the conventional design.

(3) For clarity, the thickness of the layer or region is amplified in the drawings for describing the embodiments of the present disclosure. It will be appreciated that, when an element such as a layer, a film, a region, or a substrate etc., is referred to as being "on" or "under" another element, the element may be "directly" "on" or "under" the other element, or there may be an intermediate element between the two elements.

(4) In the case of non-conflict, the features of the same embodiment and different embodiments of the present disclosure may be combined with each other.

What is described above is related to specific embodiments of the disclosure only and not limitative to the scope of the disclosure. Within the technical scope disclosed in the present disclosure herein, those skilled in the art can easily obtain other changes or replacements, without any inventive work, which should be within the scope of the disclosure. Hence, the scopes of the disclosure are defined by the accompanying claims.

The present application claims the priority of Chinese patent application No. 201621033726.6 filed on Aug. 31, 2016, the disclosure of which is hereby incorporated by reference herein in its entirety as part of this application.

The invention claimed is:

1. An array substrate, comprising: a plurality of gate lines, a plurality of data lines, and a plurality of common electrodes disposed on a base substrate; wherein, the plurality of gate lines are extended in a first direction;

the plurality of data lines are extended in a second direction, the plurality of data lines are intersected with the plurality of gate lines and insulated from the plurality of gate lines, and the second direction is different from the first direction;

the plurality of common electrodes are arranged in the second direction, at least one of the gate lines is disposed between two adjacent common electrodes, the plurality of common electrodes and the plurality of data lines are insulated from each other; each of the common electrodes comprises an overlap section, the overlap section overlaps at least one of the data lines in a direction perpendicular to the base substrate; a gap is provided between the overlap sections of two adjacent common electrodes in the second direction, both of the overlap sections overlap a same data line of the data lines in the direction perpendicular to the base substrate; an intersection of the at least one of the data lines and the at least one of the gate lines between two adjacent common electrodes is located within the gap;

the array substrate further comprises: a common electrode link disposed in the gap, the common electrode link overlaps the at least one of the data line in the direction perpendicular to the base substrate; wherein the common electrode link is electrically connected with the overlap sections of the two adjacent common electrodes in the second direction, so that the two adjacent common electrodes are electrically connected with each other; a length of the common electrode link in the first direction is smaller than a length of the overlap section in the first direction; the common electrode link and the at least one of the data lines are insulated from each other, and the common electrode link and the at least one of the gate lines are insulated from each other.

2. The array substrate according to claim 1, wherein a length of the overlap section in the first direction is equal to or greater than a length of the at least one of the data lines in the first direction, the at least one of the data lines overlaps the overlap section in the direction perpendicular to the base substrate.

3. The array substrate according to claim 1, wherein a shape of the at least one of the data lines is straight line or fold line.

4. The array substrate according to claim 1, wherein the plurality of lines and the plurality of data lines are intersected with each other to define a plurality of sub-gate pixels, each of the common electrodes corresponds to at least one of the sub-pixels.

5. The array substrate according to claim 4, wherein a width of part of the at least one of the gate lines located at an intersection with the at least one of the data lines is smaller than a width of another part of the at least one of the gate lines located between two adjacent data lines.

6. The array substrate according to claim 4, further comprising: a common electrode line electrically connected with at least one of the common electrodes, wherein the common electrode line is parallel to the at least one of the gate lines, a width of part of the common electrode line located at an intersection with the at least one of the data lines is smaller than a width of another part of the common electrode line located between two adjacent data lines.

7. The array substrate according to claim 6, wherein the at least one of the gate lines and the common electrode line are disposed in a same layer, and are disposed on two opposite sides of the at least one of the sub-pixels respectively.

8. The array substrate according to claim 7, further comprising: a pixel electrode, wherein the pixel electrode overlaps the at least one of gate lines or the common electrode line in the direction perpendicular to the base substrate; the pixel electrode and the common electrode are configured to produce an electric field to drive liquid crystal to rotate.

9. The array substrate according to claim 8, wherein at least one of the pixel electrode and the common electrode comprises a plurality of electrode strips.

10. The array substrate according to claim 8, wherein, each of the pixel electrode and the common electrode comprises a plurality of electrode strips; a plurality of pixel electrode strips and a plurality of common electrode strips are alternately arranged.

11. The array substrate according to claim 1, further comprising: a thin film transistor, wherein the thin film transistor comprises a source electrically connected with the at least one of the data lines; the source comprises at least two branches electrically connected with each other, each of branches is electrically connected with the at least one of the data lines, and a hollow section is provided between two adjacent branches.

12. A display panel, comprising the array substrate according to claim 1.

13. A display device, comprising the display panel according to claim 12.

14. The array substrate according to claim 6, wherein the at least one of the gate lines and the common electrode line are disposed in a same layer, and are disposed on a same side of the at least one of the sub-pixels.

* * * * *